United States Patent [19]

Harigane et al.

[11] Patent Number: 4,461,610
[45] Date of Patent: Jul. 24, 1984

[54] APPARATUS FOR MOUNTING CHIP TYPE CIRCUIT ELEMENTS ON PRINTED CIRCUIT BOARDS

[75] Inventors: Kotaro Harigane; Kenichi Takahashi; Hirokazu Shudo; Shuichi Tando, all of Tokyo, Japan

[73] Assignee: TDK Corporation, Japan

[21] Appl. No.: 396,491

[22] Filed: Jul. 8, 1982

Related U.S. Application Data

[63] Continuation of Ser. No. 266,109, May 21, 1981, Pat. No. 4,372,802.

[30] Foreign Application Priority Data

| Jun. 2, 1980 [JP] | Japan | 55-72753 |
| Jun. 9, 1980 [JP] | Japan | 55-79296[U] |
| Nov. 17, 1980 [JP] | Japan | 55-164509[U] |
| Nov. 17, 1980 [JP] | Japan | 55-164510[U] |
| Nov. 19, 1980 [JP] | Japan | 55-164813[U] |

[51] Int. Cl.³ .................................. B65H 3/08
[52] U.S. Cl. .................... 414/752; 414/744 B; 294/64 R; 271/103
[58] Field of Search ............... 198/377, 478; 271/102-104, 107, 108; 294/64.1, 65; 414/72, 776, 121, 627, 749 B, 752; 269/21; 156/538, 539, 556, 566, 567, 584; 29/740, 743

[56] References Cited

U.S. PATENT DOCUMENTS

| 1,717,454 | 6/1929 | Kelley | 271/103 |
| 2,915,201 | 12/1959 | Calehuff | 414/744 B |
| 3,453,714 | 7/1969 | Clark et al. | 29/743 |
| 3,475,805 | 11/1969 | Rottman | 29/740 |
| 3,883,016 | 5/1975 | Simpatico | 198/377 X |
| 4,127,432 | 11/1978 | Kuwano et al. | 156/562 X |
| 4,135,630 | 1/1979 | Snyder et al. | 29/740 |
| 4,189,137 | 2/1980 | Denney et al. | 294/64.1 X |
| 4,292,116 | 9/1981 | Takahashi et al. | 156/566 |

Primary Examiner—Leslie J. Paperner
Assistant Examiner—Terrance L. Siemens
Attorney, Agent, or Firm—Steinberg & Raskin

[57] ABSTRACT

Apparatus for mounting chip type circuit elements on a printed circuit board include a supply unit for supplying chip type circuit elements, a plurality of pallets adapted to be conveyed intermittently in a longitudinal direction, a sequence head adapted to shift the circuit elements onto the pallets, an X-Y table adapted to receive and support a printed circuit board, a mounting mechanism having mounting heads adapted to mount the chip type circuit elements on the printed circuit board carried by the X-Y table, and a shifting head for shifting the chip type circuit elements from the pallets to the mounting head of the mounting mechanism. The mounting mechanism constitutes a rotatably indexing disc on which a plurality of mounting heads are radially situated, the sequence heads, shifting head and mounting heads each utilizing suction pins to which the chip type circuit elements are fixed during their movement from the supply unit to the printed circuit board.

10 Claims, 28 Drawing Figures

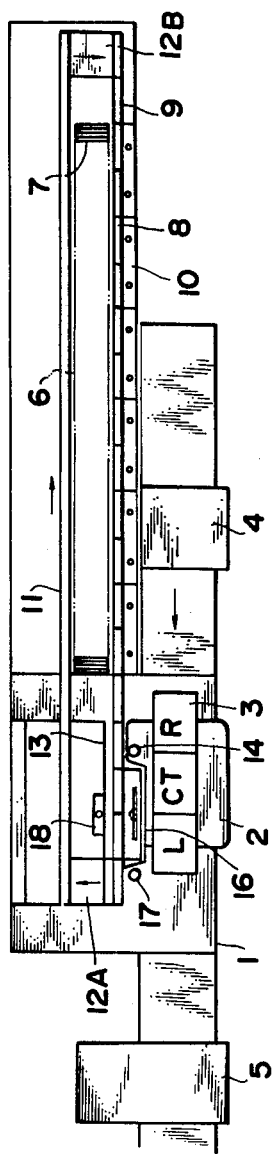
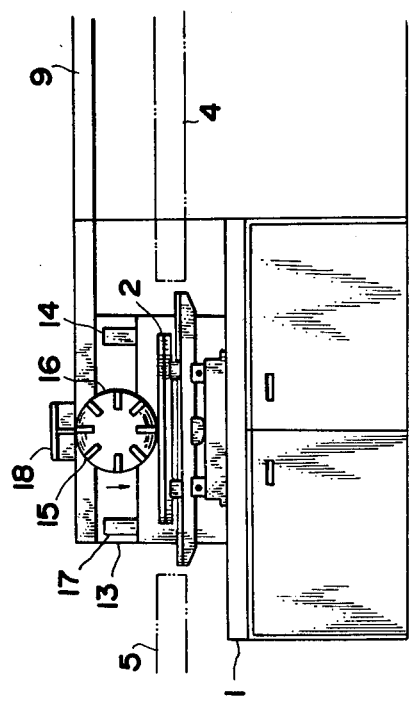

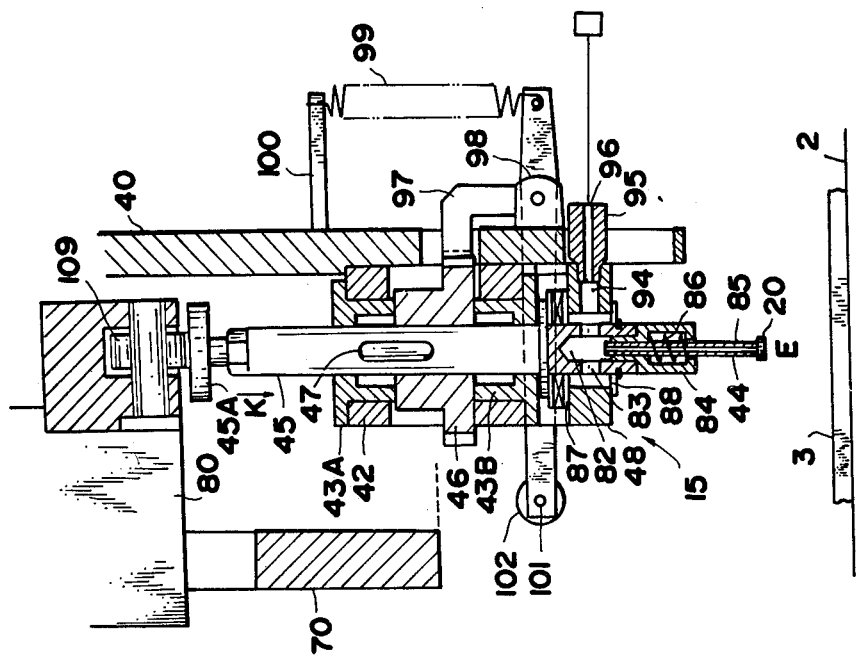
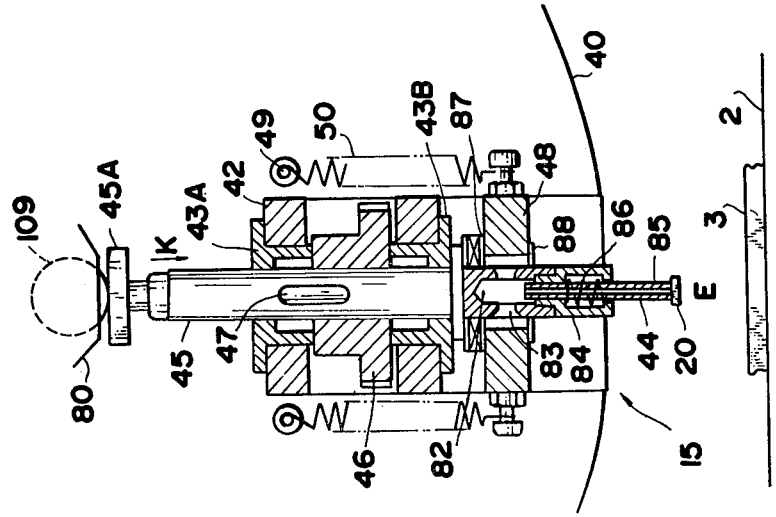

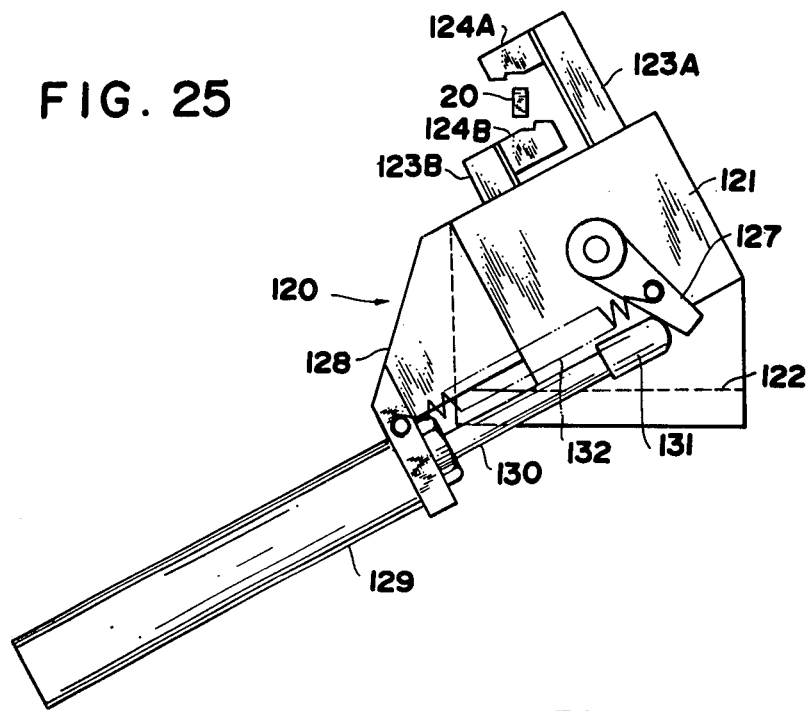
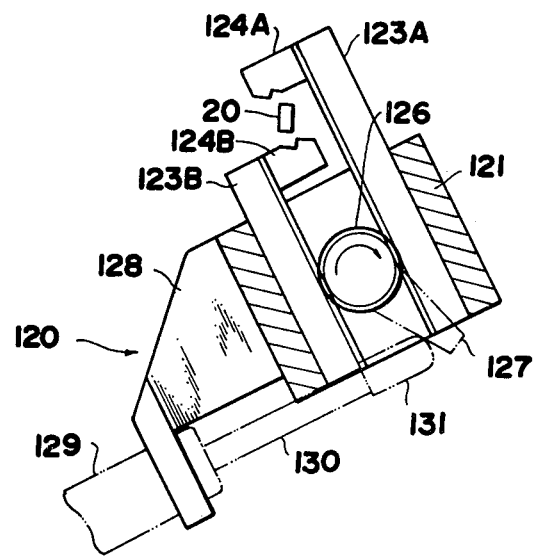

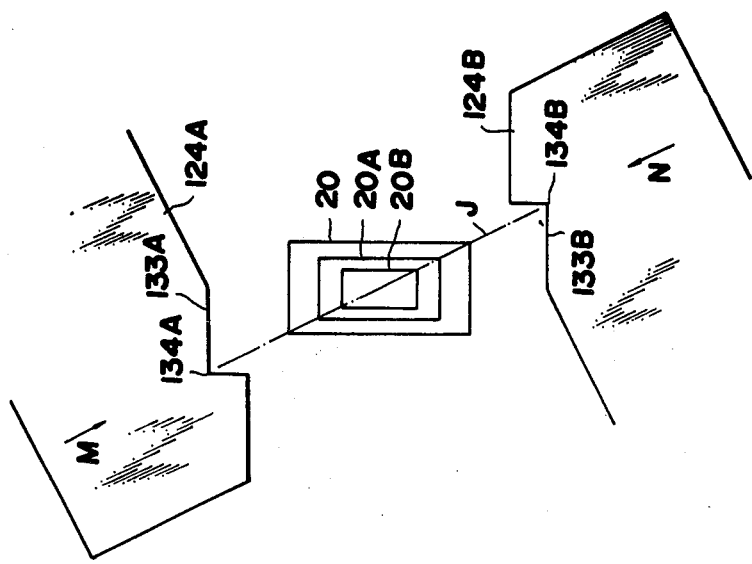
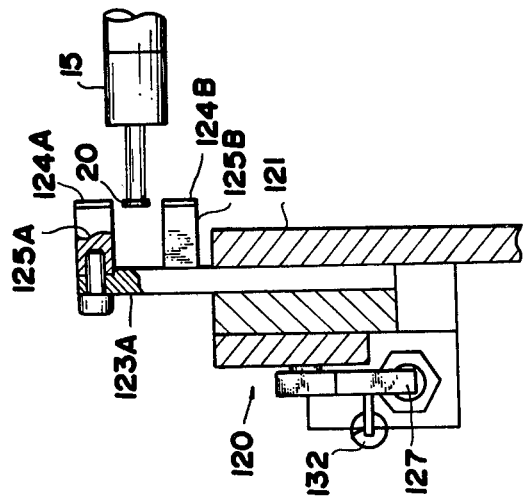

APPARATUS FOR MOUNTING CHIP TYPE CIRCUIT ELEMENTS ON PRINTED CIRCUIT BOARDS

This is a continuation of application Ser. No. 266,109 filed May 21, 1981, now U.S. Pat. No. 4,372,802, issued Feb. 8, 1983.

BACKGROUND OF THE INVENTION

This invention relates generally to apparatus for mounting chip type circuit elements on a printed circuit board and, in particular, to apparatus for mounting chip type circuit elements which do not have lead wires associated therewith on a printed circuit board in a serial or one-by-one fashion.

U.S. patent application Ser. No. 28,924, filed April 10, 1979, assigned to the same assignee as the instant application, discloses apparatus for mounting chip type circuit elements on a printed circuit board. Such apparatus includes a suction plate adapted to pick up and hold a multiplicity of chip type circuit elements and convey the same to a printed circuit board on which they are mounted.

Such mounting apparatus which incorporates the suction plate described above has a disadvantage in that it is difficult to utilize the same when it is desired to mount the chip type circuit elements after electronic elements having lead wires are inserted into the printed circuit board.

The transfer of chip type circuit elements from a supply unit having a feed mechanism to a conveyor pallet or directly to a printed circuit board utilizing suction apparatus has also presented problems in conventional apparatus. Further, in apparatus for mounting chip type circuit elements on a printed circuit board wherein the chip type circuit elements are carried and conveyed on a pallet, problems arise in cases where the upper surface of the pallet is flat. In such cases, it is difficult to reliably prevent positional deviations of the chip type circuit elements or rotations of the same during operation.

Still further, in apparatus for conveying chip type circuit elements to a printed circuit board which utilize suctioning of the circuit element on a mounting head, it is not uncommon for the circuit element to deviate from its desired position. Where such positional deviations are unduly large, the electrodes of the circuit element may be spaced an undesirable amount from the conductor pattern printed on the circuit board resulting in various problems, such as failure of connections. It is also necessary in some instances to adjust the position of the chip type circuit elements on the mounting head during normal operation.

SUMMARY OF THE INVENTION

Accordingly, one object of the present invention is to provide new and improved apparatus for mounting chip type circuit elements on printed circuit boards in one-by-one fashion.

Another object of the present invention is to provide new and improved apparatus for mounting chip type circuit elements on printed circuit boards in a reliable fashion even after other electronic components have been inserted in the printed circuit board.

Still another object of the present invention is to provide a new and improved suction head for holding and smoothly conveying the chip type circuit elements.

A further object of the present invention is to provide a new and improved pallet for use with apparatus for mounting chip type circuit elements on printed circuit boards, the pallet being capable of conveying such circuit elements in a manner such that any deviation or rotation of the circuit elements from their desired position is avoided.

A still further object of the present invention is to provide a new and improved mounting head mechanism for use in connection with apparatus for mounting chip type circuit elements on printed circuit boards and which is capable of mounting the circuit element in a reliable fashion even after the insertion of other electronic components having electrical leads are inserted in the printed circuit board.

Yet another object of the present invention is to provide a new and improved device for positioning chip type electronic components of various sizes and shapes into a desired position as the circuit elements are conveyed to a printed circuit board.

Briefly, in accordance with the present invention, these and other objects are attained by providing apparatus including a supply unit adapted to supply chip type circuit elements, a plurality of pallets adapted to be conveyed in an intermittent fashion in a longitudinal direction, sequence heads adapted to shift the circuit elements onto the pallet, an X-Y table adapted to support a printed circuit board, a mounting mechanism having mounting heads associated therewith for mounting the chip type circuit elements on the printed circuit board supported by the X-Y table and a shifting head for picking up the chip type circuit elements from the pallets and delivering the same to the mounting heads of the mounting mechanism.

The sequence and/or shifting heads preferably constitute a suction head including a supporting block, a pneumatic cylinder associated with the supporting block which includes an outer cylinder, a piston slidably received within the outer cylinder and a suction pin operatively connected to the piston, the suction pin having a suction port opening at its lower end surface. Another suction port is formed in the outer cylinder which is connected to a cylinder vacuum.

The pallets which are adapted to carry the chip type circuit elements preferably include an adhesive mat which forms the surface for carrying the chip type circuit element and a plurality of lifting pins which are adapted to project from the surface of the adhesive mat.

The mounting mechanism which mounts the chip type circuit elements on the printed circuit board preferably constitutes an indexing member adapted to be rotated in an intermittent fashion and a plurality of mounting heads provided on the indexing member. Each of the mounting heads includes a mounting head shaft which is rotatable and slidable so that the same can be driven to a predetermined position in an axial direction by an actuator. A suction pin is mounted on the end of each of the mounting head shafts which is adapted to pick up and hold a circuit element. A gear mechanism is provided which is adapted to transmit a torque to the mounting head shaft when it reaches a predetermined position.

DESCRIPTION OF THE DRAWINGS

A more complete appreciation of the present invention and many of the attendant advantages thereof will be readily appreciated as the same becomes better understood by reference to the following detailed description when considered in connection with the accompanying drawings in which:

FIG. 1 is a plan view of apparatus for mounting chip type circuit elements to printed circuit boards in accordance with an embodiment of the present invention;

FIG. 2 is a front elevational view of one portion of the apparatus illustrated in FIG. 1;

FIG. 21 is a front elevational view in section of a mounting head utilized in the mounting mechanism of the present invention;

FIG. 22 is a side elevational view in section of the mounting head illustrated in FIG. 21;

FIG. 25 is a view in the direction of arrow K of FIG. 24 of the chip type circuit element positioning apparatus;

FIG. 26 is a horizontal sectional view of the apparatus illustrated in FIG. 25;

FIG. 27 is a side elevational view in section of the apparatus illustrated in FIG. 24; and FIG. 28 is an enlarged view of the claws forming a part of the circuit element positioning apparatus illustrated in FIG. 25.

DESCRIPTION OF THE PREFERRED EMBODIMENTS

Figure 3:
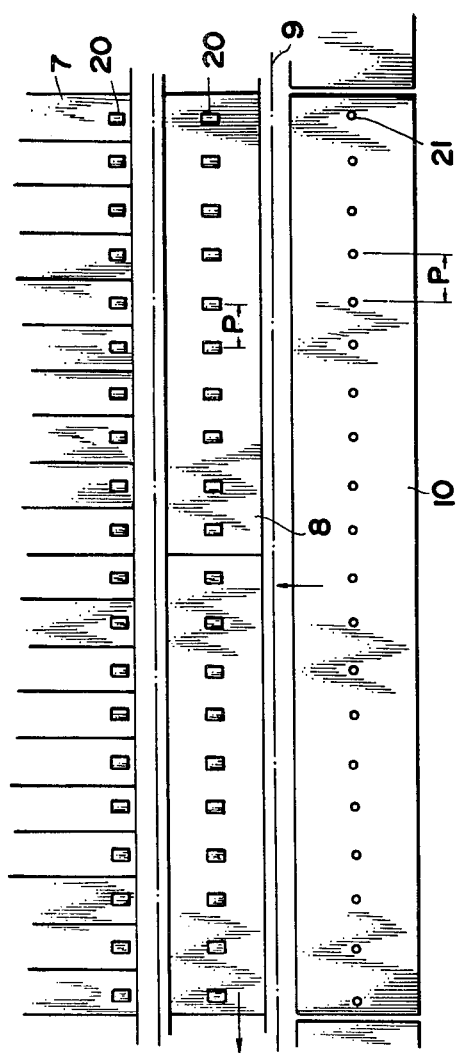
FIG. 3 is a plan view illustrating the mutual positional relationship of the supply unit, pallet and sequence head of the apparatus of the present invention.

A description of the construction and operation of the apparatus for mounting chip type circuit elements on printed circuit boards in its entirety will first be provided. More detailed descriptions of certain ones of the components of the apparatus then follow.

General Description of Apparatus

Referring to FIGS. 1-10 wherein like reference characters designate identical or corresponding parts throughout the several views, and more particularly to FIGS. 1 and 2, apparatus for mounting chip type circuit elements on printed circuit boards according to the present invention include a frame base 1 which carries an X-Y table (NC table) 2 at the right side of which (as seen in the figures) is disposed a loader 4 for supplying printed circuit boards 3. An unloader 5 is disposed at the left side of the X-Y table 2 for removing the particular printed circuit board 3 carried on the X-Y table.

A supply unit 6 having a part feeder is disposed at a level above the surface of the X-Y table 2, the part feeder being provided with a plurality of tracks 7 for discharging chip type circuit elements. A pallet transfer 9 is provided for intermittently driving pallets 8 along the forward ends of the track 7. Sequence heads 10 are arranged along the pallet transfer 9 for shifting the chip type circuit elements which have been situated on the tracks 7 to the pallets 8.

A return conveyor 11 is situated at the rear side of the supply unit 6 and extends parallel to the pallet transfer 9. A pallet 8 which has reached the left side end of the pallet transfer 9 is shifted to the return conveyor 11 by a pallet traversing mechanism 12A whereupon that pallet is moved to the right side of the pallet transfer 9. Similarly, as each pallet 8 reaches the right side end of the apparatus, it is moved to the pallet transfer 9 by means of a pallet traversing mechanism 12B.

A frame 13 is fixed to the base 1 and projects upwardly therefrom at the rear side of the X-Y table 2. A dispenser 14 is disposed at the front side of the frame 13 for supplying an adhesive to the printed circuit board 3 when the latter is situated on the X-Y table 2.

A mounting mechanism 16 is provided having mounting heads 15 for mounting the chip type circuit elements on the portion of the printed circuit board 3 where adhesive has been applied. A checker 17 for detecting any mis-mounting of the circuit elements is provided rearwardly of X-Y table 2. Additionally, a shifting head 18 for shifting the chip type circuit elements from the pallet 8 to the mounting head 15 is disposed at an upper part of the frame 13.

The tracks 7 of the supply unit 6 are adapted to deliver specific chip type circuit elements in accordance with a predetermined mounting program as best seen in FIG. 3. In the illustrated embodiment, each pallet 8 has a length 10P which is 10 times as large as the pitch P of the intermittent feed undergone by the pallets transfer 9. In this manner, it is possible to arrange 10 chip type circuit elements 20 at a pitch P. As seen in FIG. 3, the sequence head 10 has a length corresponding to the sum of the lengths of 2 pallets 8. A sequence head 10 carries 20 suction pins 21 which are arranged at the same pitch P.

Figure 4:
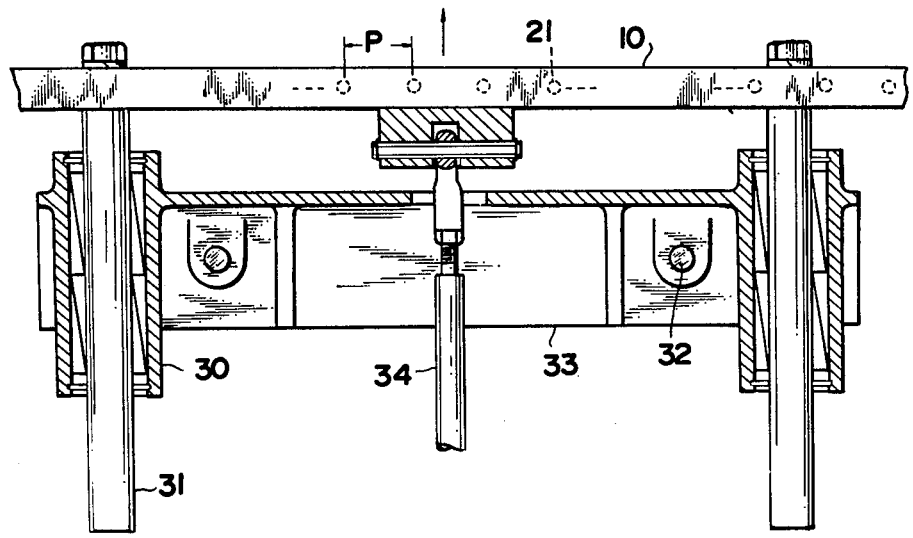
FIG. 4 is a plan view of the sequence head of the apparatus of the present invention, shown partly in section.
Figure 5:
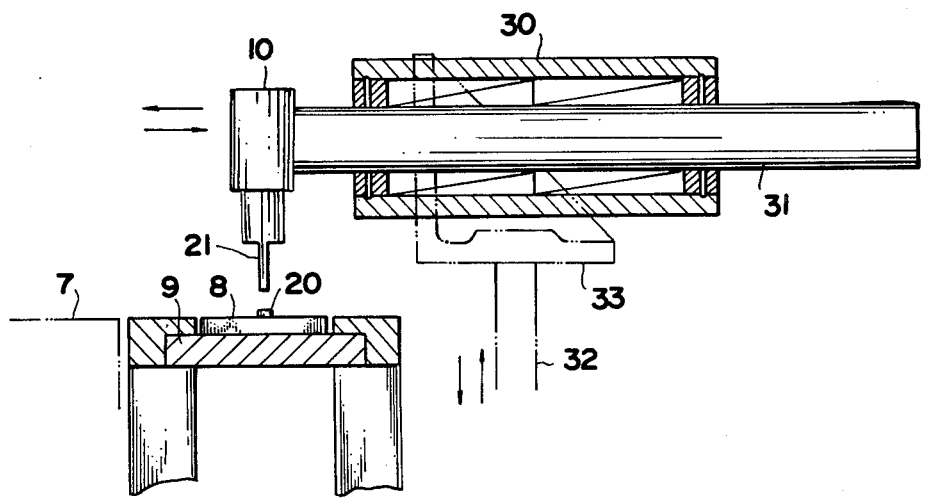
FIG. 5 is a side elevational view shown partly in section of the sequence head illustrated in FIG. 4.

Referring to FIGS. 4 and 5, each sequence head 10 is fixed to a horizontal rod 31 which is mounted within a ball bush 30 for sliding movement in the horizontal direction. The ball bush 30 is itself fixedly mounted on a vertical frame 33 which in turn is fixed to a vertical shaft 32. Additionally, a cam lever 34 is fixed to the sequence head 10 for horizontally reciprocating the same.

Thus, the sequence head 10 can be vertically reciprocated in accordance with the vertical movement of the vertical shaft 32 and can be horizontally reciprocated in accordance with the movement of the cam lever 34.

The suction pins 21 are arranged at the same pitch P as the intermittent feed of the pallet transfer 9 which, as noted above, has the same pitch as the arrangement of the chip type circuit elements. The suction pins 21 have hollow, pipe-shaped bodies as in the case of air pin sets. Thus, the suction pin 21 is adapted to pick up and hold a chip type circuit element 20 as vacuum is transmitted to the internal cavity thereof.

The position of the sequence head 10 is adjusted so that the suction pins 21 pick up the chip type circuit element 20 from the track of the supply unit 6 whereupon the sequence head 10 is raised and moved horizontally to a position vertically above the pallet 8. At this time, the sequence head 10 is lowered and the suction pins 21 release the circuit elements 20 so that the latter are mounted on the pallet 8. This operation is performed in a periodic manner whereby chip type circuit elements are mounted on the pallet in accordance with a predetermined mounting sequence.

The pallets 8 are intermittently moved in a longitudinal direction (to the left as seen in FIG. 1) by the pallet transfer 9 at a predetermined pitch. Upon a pallet 8 reaching a position in front of the shifting head 18, the latter operates to transfer or shift the chip type circuit element 20 from the pallet 8 to the mounting head 15 of the mounting mechanism 16.

Figure 6:
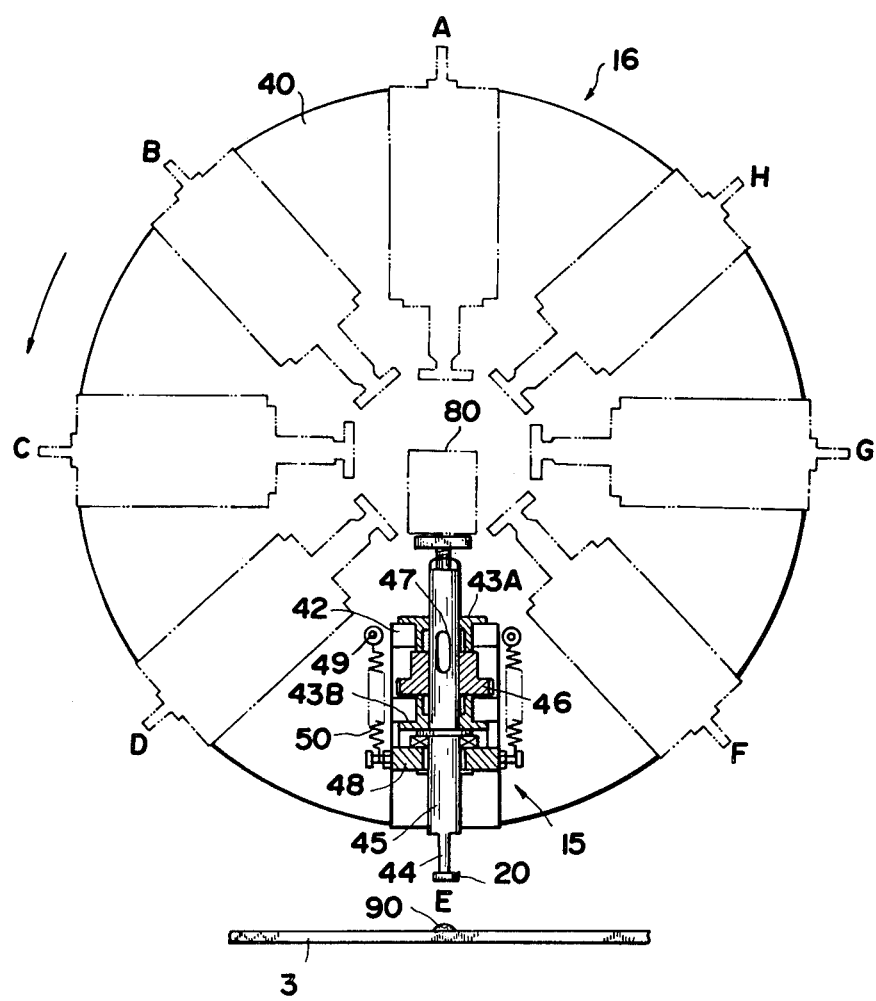
FIG. 6 is a front elevational view of a mounting mechanism of the apparatus of the present invention.
Figure 7:
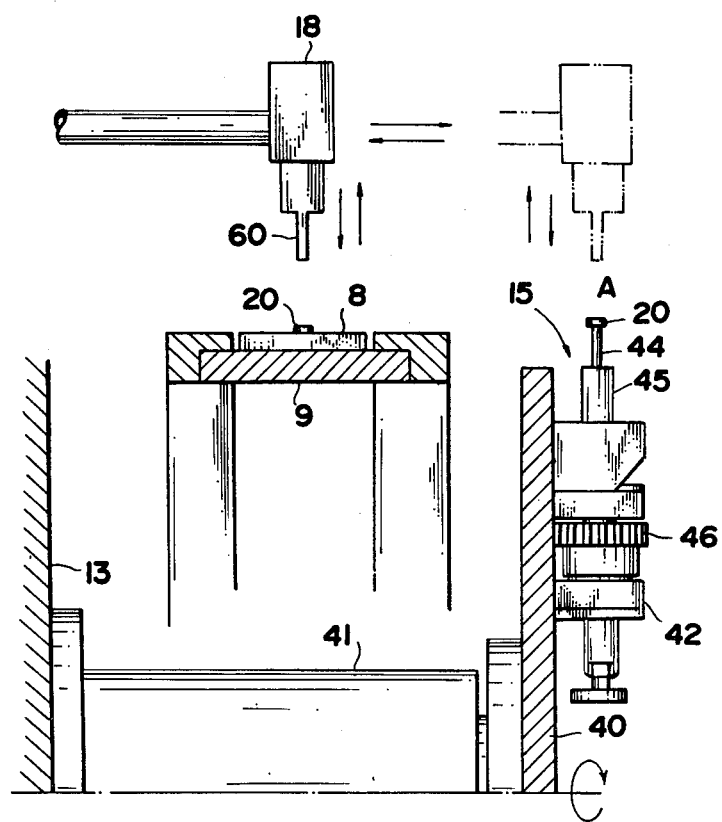
FIG. 7 is a side elevational view shown partly in section illustrating the mutual positional relationship between the mounting mechanism, pallets and shifting head of the present invention.
Figure 8:
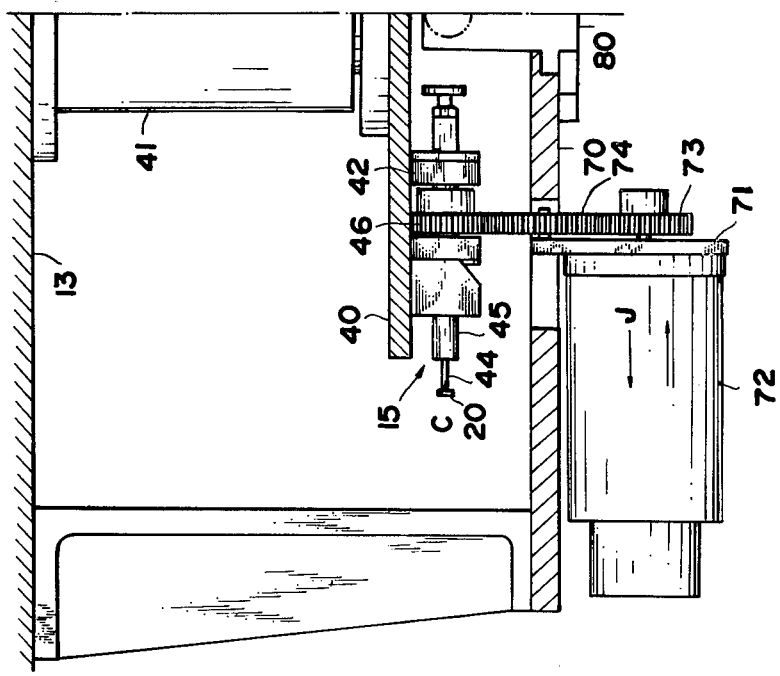
FIG. 8 is a plan view shown partly in reaction of apparatus for adjusting the position of the chip type circuit element on the mounting head of the mounting mechanism of the present invention.

Referring to FIG. 6, the mounting mechanism 16 constitutes a rotatably mounted indexing disc 40 on which eight mounting heads 15 are radially arranged at 45° intervals. The indexing disc 40 is fixed to a rotary drive shaft 41 which projects forwardly from the frame 13 as seen in FIGS. 7 and 8. The drive shaft 41 is itself adapted to be rotatably driven in an intermittent fashion through 45° intervals.

Each of the mounting heads 15 are essentially identical to the others and only one is shown and described for purposes of clarity. A mounting member 42 is fixed to the indexing disc 40 and carries bearings 43A and 43B which themselves support a mounting head shaft 45 which is provided with a suction pin 44 at its end in a manner such that the mounting head shaft 45 is slidable in the radial direction on the indexing disc 40. A gear 46 is keyed to the periphery of the mounting head shaft 45 so as to be rotatable as a unit with the latter. Such mounting is accomplished by a keyway 47 which, although preventing rotation of gear 46 with respect to the shaft 45 does not prevent the gear 46 from moving in the axial direction of the mounting head shaft 45 relative to the latter. A spring attachment block 48 is fitted to the mounting shaft 45 for axial movement as a unit with the latter. Tension springs 50 extend between the spring attachment block 48 and a spring retainer 49 projecting from the indexing disc 40. In this manner, the suction pin 44 is continuously biased in a retracting direction by the springs 50, i.e., in a direction towards the center of the indexing disc 40. The suction pin 44 has a hollow pipe-like construction and is adapted to pick up and hold a chip type circuit element upon the internal cavity of the pin being communicated with a vacuum source.

The mounting heads 15 are adapted to be successively moved in an intermittent fashion from the position A to positions B, C, D, E, F, G and H as shown in FIG. 6 in accordance with the rotation of the indexing disc 40.

Each mounting head 15 is adapted to receive a chip type circuit element from the shifting head 18 when the mounting head is directed upwardly, i.e., when in the position A in FIG. 6.

Referring to FIG. 7, the shifting head 18 is provided with one suction pin 60 which, like the suction pins 21 of the sequence head 10 has a hollow pipe-shaped body and is adapted to pick up and hold the chip type circuit element 20 as a vacuum is applied to the internal cavity thereof. As shown in FIG. 7, the shifting head 18 moves downwardly over the pallet 8 to pick up and hold a chip type circuit element 20 whereupon the shifting head 18 moves upwardly and then horizontally to a position above the particular mounting head 15 which is in position A on indexing disc 40 as shown in phantom. Subsequently, the shifting head 18 is lowered to deliver the circuit element 20 to the suction pin 44 of the mounting head 15. After the circuit element is delivered to the mounting head 15 as described above, the shifting head 18 releases the same and moves upwardly to resume the position above the pallet 8. The chip type circuit element thus delivered is held by the suction pin 44 of the mounting head 15.

Referring to FIG. 8, upon the mounting head 15 being rotated to its lateral position, i.e., position C on indexing disc 40, the mounting direction of the chip type circuit element 20 is adjusted. More particularly, an attaching plate 70 is fixed to the frame 13 in a manner so as to extend transversely of the indexing disc 40. A motor mounting plate 71 is vertically attached to the attaching plate 70 so that it is able to slide in a lateral direction as indicated by arrows J. A pulse motor 72 is mounted on motor mounting plate 71 having a gear 73 fixed to its output shaft. A gear 74 is rotatably mounted on mounting plates 71 and meshes with the gear 73 of pulse motor 72. During the intermittent rotation of indexing disc 40, the mounting plate 71 is retracted to the left as seen by the upper arrow J in FIG. 8 so as not to hinder the rotation of indexing disc 40 whereby the gear 74 is disengaged from the gear 46 of mounting head 15. When the rotation of indexing disc 40 is terminated, the gears 74 and 46 are engaged with each other so as to adjust the mounting direction of the chip type circuit element 20. In the illustrated embodiment, the mounting head shaft 45 of mounting head 15 is rotated 15° for each operation step of the pulse motor 72.

Referring back to FIG. 6, upon the mounting head 15 reaching position E, i.e., its downwardly directed position, a cam follower 80 mounted for vertical movement on attaching plate 70 as shown in FIG. 8, depresses the head of the mounting head shaft 45 whereby the chip type circuit element 20 held on the suction pin 44 contacts the printed circuit board 3 and is attached thereto by adhesive as described above.

Figure 9:
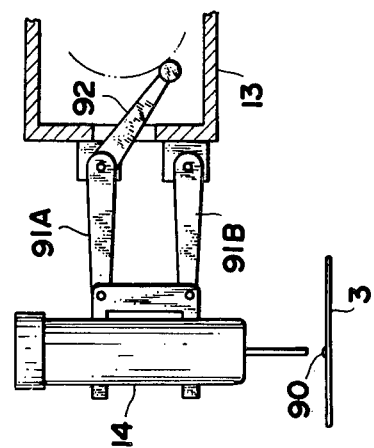
FIG. 9 is a side elevational view taken partly in section of an adhesive dispenser utilized in connection with the present invention.

A printed circuit board 3 is supplied by the loader 4 to the right side position R of the X-Y table 2 as shown in FIG. 1. Prior to the chip type circuit element 20 being mounted on the printed circuit board as described above, an adhesive 90 is applied by a dispenser 14 to the printed circuit board 3 as shown in FIG. 9. More specifically, referring to FIG. 9, the dispenser 14 is pivotally attached to the frame 13 by a pair of parallel links 91A and 91B in a manner such that the dispenser 14 can be vertically positioned. In this connection, a lever 92 is operatively connected to link 91A for driving the same.

Figure 10:
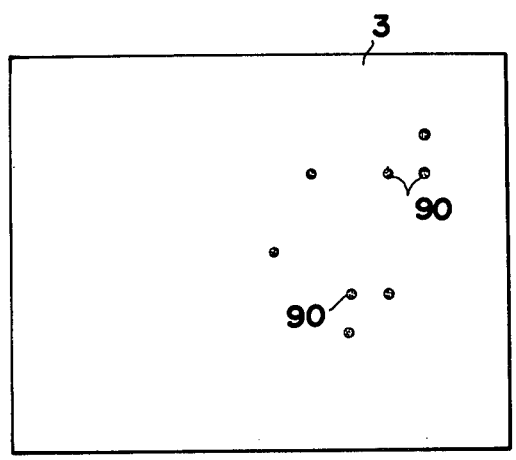
FIG. 10 is a plan view illustrating a printed circuit board having adhesive applied thereto.
Figure 12:
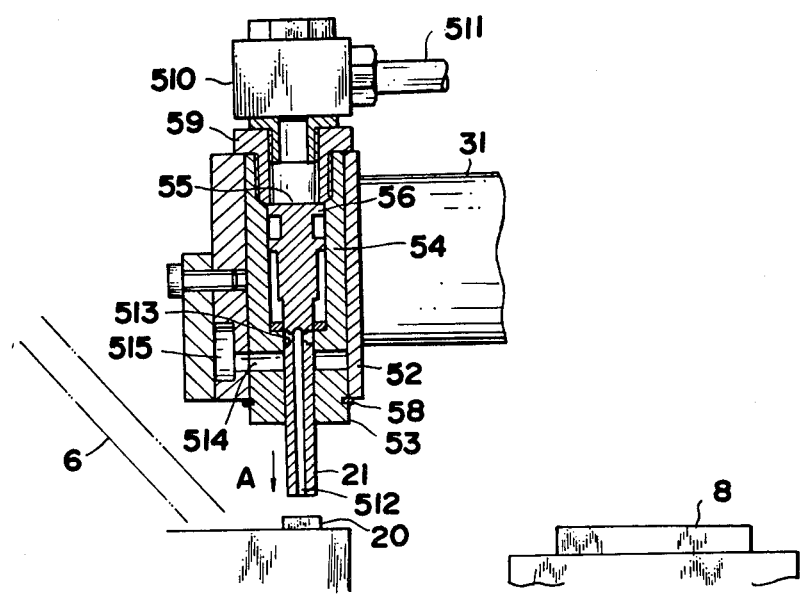
FIGS. 12-15 are side elevational views in section illustrating the different successive phases of operation of the suction head illustrated in FIG. 11.
Figure 11:
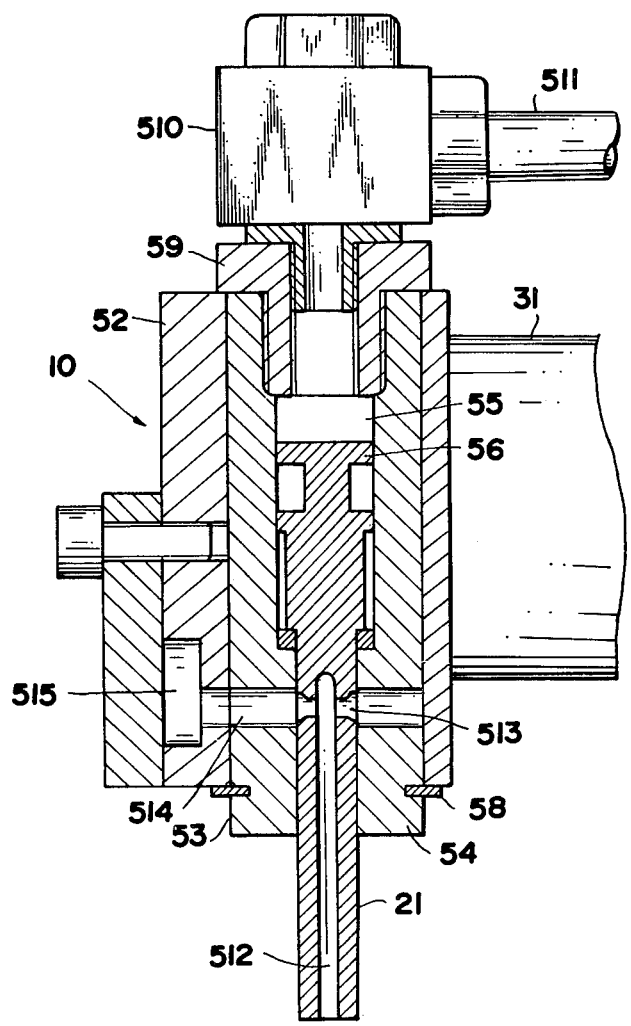
FIG. 11 is a side elevational view in section of a suction head for use in connection with the sequence and/or shifting heads of the present invention.

In the illustrated embodiment, the dispenser 14 applies adhesive 90 to the positions on the printed circuit board 3 where the chip type circuit elements are to be mounted as seen in FIG. 10 in a sequential manner repeating the vertical movements described above.

The operation of the chip type circuit element mounting apparatus of the present invention will now be described. At the initial stage of operation, the X-Y table 2 assumes an origin position and in this condition the supply of the printed circuit board is commenced to the right position R of the X-Y table 2.

At this point, adhesive is applied according to a predetermined program to the locations on the printed circuit board 3 to which the circuit element are to be mounted by means of the dispenser 14. The X-Y table 2 is then returned to its origin position after the completion of the adhesive application. During this procedure, the sequence head 10, shifting head 18, and mounting head 15 remain idle.

While the X-Y table is stationary at its point of origin after the application of adhesive to the printed circuit board 3 a plurality of chip type circuit elements 20 are mounted on a pallet 8 by means of the sequence head 10 according to a predetermined program as described above.

Thereafter, the pallets 8 are moved to the left in an intermittent fashion by the pallets transfer 9 so that the circuit elements 20 on the pallets 8 are successively shifted to the mounting heads 15 through the operation of the shifting head. The operation is momentarily stopped as the mounting head 15 carrying the first circuit element reaches the mounting position E as shown in FIG. 6.

During the momentary stoppage of operation, the printed circuit board 3 which has reached the right-side position on the X-Y table 2 is then moved to a central position CT and a new printed circuit board is supplied to the right side position R by the loader 4.

Thereafter, the mounting of the chip type circuit element 20 to the printed circuit board 3 which is in the central position CT and the application of the adhesive to the printed circuit board 3 on the right side position R are simultaneously commenced.

The mounting head shaft 45 of the mounting head 15 upon reaching the position E of FIG. 6 is depressed by the cam follower 80 so that the suction pin 44 is lowered to press the chip type circuit element 20 held by the suction pin 44 onto the portion of the printed circuit board 3 where adhesive has been applied whereupon the circuit element is mounted on the printed circuit board 3. The application of the vacuum to the suction pin 44 is stopped only when the mounting head shaft 45 has been lowered so that the mounting operation of the circuit element onto the printed circuit board can be reliably accomplished.

After the operations described above have been completed, the X-Y table 2 is returned to its original position so that the printed circuit board 3 on which the chip type circuit element has been mounted is moved from the central position CT to the left position L while at this time the subsequent printed circuit board is removed from the right side position R to the central position CT. During this time, a new printed circuit board is fed to the right side position R.

Thus, the application of adhesive to the printed circuit board and the mounting of the chip type circuit element thereto are accomplished at the right side R and central CT positions, respectively. Simultaneously, checker 17 operates to monitor and detect any mismounting of the circuit element on the printed circuit board at the left side position L. If no mismounting is detected, the printed circuit board is removed from the X-Y table 2 by means of the unloader 5.

In accordance with the embodiment of the invention described above, it is possible to mount the chip type circuit elements even after the printed circuit board has been loaded with other electronic components since the mounting of the circuit elements 20 on the printed circuit board 3 is achieved by means of the mounting head 15 having suction pins 44. Additionally, by virtue of the operation of the sequence head 10, it is possible to arrange different kinds of chip type circuit elements 20 on the train of pallets B in an appropriate sequence so that it is possible to mount a plurality of different kinds of chip type circuit elements on the printed circuit board.

It should be noted that the gear 46 of the mounting head 15 of mounting mechanism 16 is locked in a particular position by a lock mechanism unless it is necessary to alter the mounting direction of the chip type circuit element.

Thus, according to the present invention, apparatus for mounting chip type circuit elements on printed circuit boards are provided wherein the circuit elements can be mounted on even small vacant spaces provided on the printed circuit board.

Suction Heads

Referring now to FIGS. 11-15, the constructional and operational details of a suction head will be described. Such description will be in connection with a sequence head 10 which shifts the chip type circuit elements from the part feeder of supply unit 6 to the pallets 8 and it is understood that such suction heads may be utilized, for example, with the shifting head 18 for shifting the chip type circuit elements from the pallets to the mounting heads 15.

Referring to FIGS. 11-15, a supporting block 52 is fixed to the end of the supporting rod 31 which is mounted for reciprocating movement both horizontally and vertically. A pneumatic cylinder 53 is situated within the bore of supporting block 52. The pneumatic cylinder 53 includes an outer cylinder 54, a piston 56 slidably received within a cylindrical chamber 55 in the cylinder 54 and suction pin 21 integral with the piston 56 and extending downwardly from the latter. The pneumatic cylinder 53 is fixed to the supporting block 52 by a retainer ring 58 which is fitted around the outer cylinder 54 and a screw member 59 threaded within an upper opening of the outer cylinder 54. The cylindrical chamber 55 is adapted to be supplied with compressed air through a compressed air supply pipe 511 via a joint 510. The suction pin 21 is provided with a central axial suction port 512 which opens at its lower end surface and a radial bore 513 communicating with the suction port 512. Suction bores 514 and 515 formed in the outer cylinder 54 and in the supporting block 52, respectively, are adapted to communicate with the bore 513 when the suction pin 21 is in a lower position. The suction port 515 is connected through a suction pipe to a vacuum source such as a vacuum pump.

Figure 13:
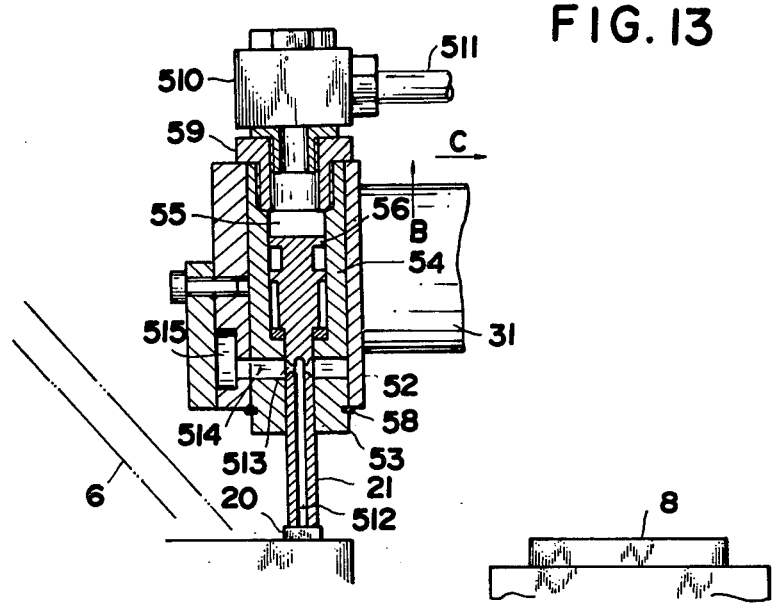
Figure 14:
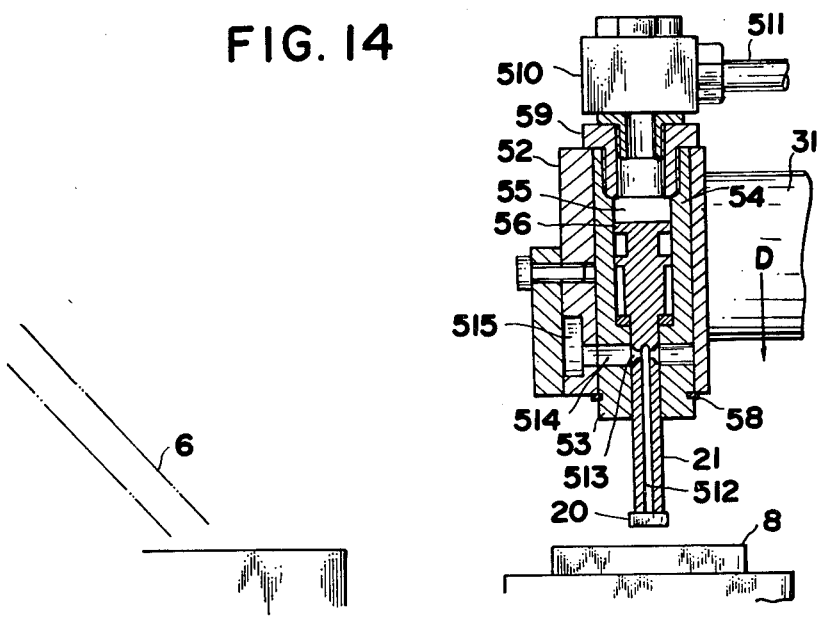
Figure 15:
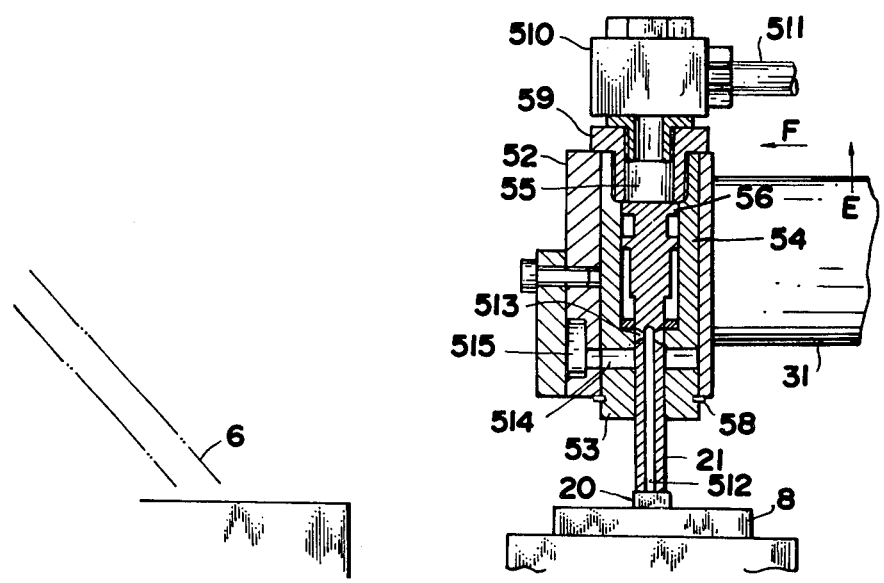

The operation of the suction head will now be described with reference to FIGS. 12–15 in an application wherein the suction head is used for shifting the chip circuit elements from the part feeder of supply unit 6 to conveyor pallet 8. In a first stage, the suction head is moved to a position above a chip type circuit element 20 disposed at the discharge opening of the part feeder of supply unit 6. In this position, the piston 56 is retracted so that the suction pin 21 is in a raised position. Thus, the bore 513 is offset from the suction bore 514 so that no suction is applied to the bore. As compressed air is supplied to the chamber 55 of pneumatic cylinder 53, the piston 56 and suction pin 21 are lowered as a unit as indicated by arrow A so that the lower end surface of suction pin 21 is brought into contact with the chip type circuit element 20 as shown in FIG. 13. At this stage, the bores 513 and 514 are aligned with each other so as to allow the vacuum to be applied through the suction port 512 so that the suction head picks up and holds the chip type circuit element 20. Thereafter, the supporting rod 31 is lifted as illustrated by arrow B and then retracted as indicated by arrow C to a position wherein the suction head is located above the pallet 8 for conveying the chip type circuit elements thereto as shown in FIG. 14. At this time, the supply of compressed air to the pneumatic cylinder 53 is terminated so as to permit the piston 56 to be retracted whereupon the supporting rod 31 is lowered as shown by arrow D. As a result, the chip type circuit element is placed on the pallet 8. At this stage, since the suction pin 21 abuts the pallet 8 through the chip type circuit element 20 the piston 56 is moved to a raised position to terminate the suction action applied though the suction port 512 to thereby release the chip type circuit element 20. Thereafter, the supporting rod 31 is raised as shown by arrow E and then moved forwardly as shown by arrow F to resume the position illustrated in FIG. 12.

In the illustrated embodiment, the suction applied through suction port 512 of suction pin 21 can be turned on and off in relation to the operation of piston 56 so that the pickup, transfer and release of the chip type circuit element can be executed in an easy and smooth manner.

It will be understood that only a single one or a plurality of pneumatic cylinders may be used with a single supporting block 52. If a plurality of pneumatic cylinders are used, it is possible to shift a plurality of chip type circuit elements at one time. As noted above, although the illustrated embodiment is described for use in connection with shifting the chip type circuit elements from the part feeder of supply unit 6 to a pallet 8, the suction head can be equally applied to the shifting of the chip type circuit element from a part feeder or pallet to a printed circuit board or mounting head or for like purposes.

Utilizing the construction of the suction heads described above, the chip type circuit elements can be picked up, held and shifted in a smooth and reliable manner.

Pallets

Figure 16:
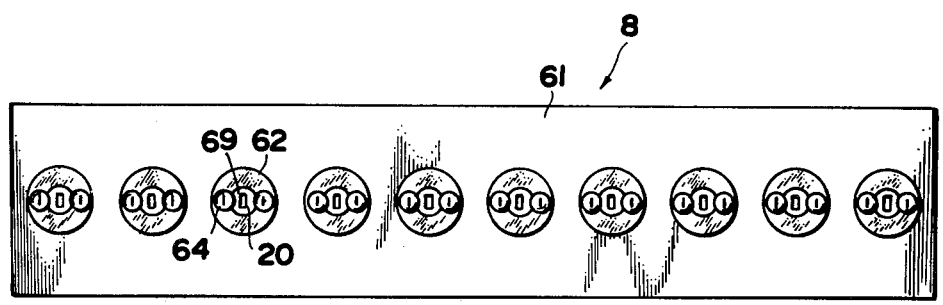
FIG. 16 is a plan view of a pallet for conveying chip type circuit elements according to one embodiment of the present invention.
Figure 17:
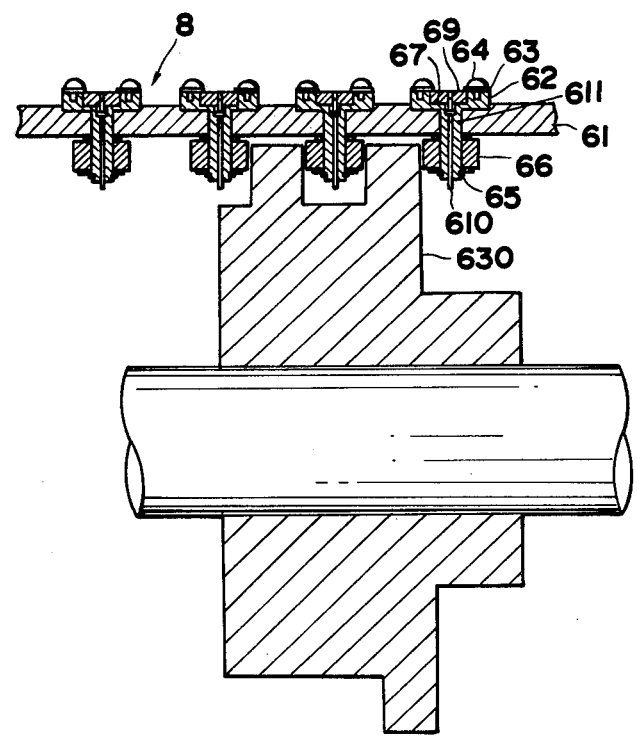
FIG. 17 is a longitudinal sectional view of the pallet illustrated in FIG. 16.
Figure 18:
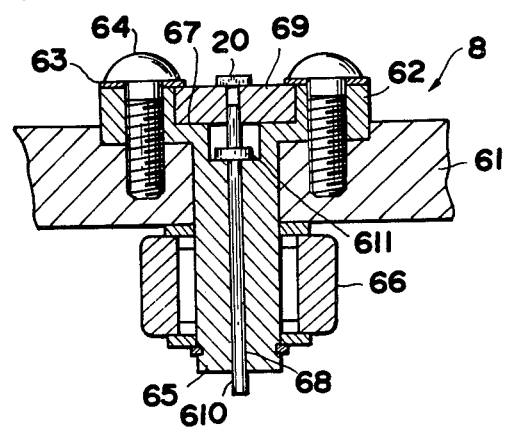
FIG. 18 is an enlarged sectional view of one part of the pallet illustrated in FIG. 17.

Referring now to FIGS. 16–18, the construction of a pallet 8 suitable for use in the overall arrangement of the present invention will be described.

A plurality of members 62 for carrying chip type circuit elements, each having a disc-shaped upper end, are fixed to a rectangular flat bed plate 61 at a constant pitch by means of washers 63 and screws 64. The lower portion of each element carrying member 62 has the configuration of a shaft 65 which extends downwardly through the bed plate 61. A roller 66 is rotatably mounted on the shaft 65. A stepped recess 67 is formed at the central portion of the upper surface of the element carrying member 62. A through bore 68 is formed in the bottom of the stepped recess 67 and opens at the lower end surface of the shaft 65. An adhesive mat 69 having an adhesive surface is fitted within the stepped recess 67 and is fixed therein by washers 63.

A lift pin 610 is slidably mounted within bore 68. The lift pin 610 is provided with a retaining collar 611 at a portion proximate to the upper end thereof. When the pin 610 assumes a lower position in which the retaining collar 611 contacts the bottom of the stepped recess 67, the upper end of the pin 610 is retracted from the surface of the adhesive mat 69. The upper end of the pin 610 extends upwardly beyond the surface of the adhesive mat 69 only when the lower end of the lift pin 610 is pushed upwardly.

The pallet 8 for conveying chip type circuit elements constructed in the manner described above is supported for horizontal movement by a guide of a pallet transfer mechanism. The chip type circuit element 20 which has been held by a suction head as described above is delivered to the adhesive mat 69. Consequently, the chip type circuit element 20 is held on the pallet 8 through adherence to the adhesive mat 69 in a manner so as not to deviate from its correct position. The pallet 8 is moved in a predetermined direction in accordance with the rotation of a barrel cam 630 which engages with the rollers 66. As the pallet 8 is moved in its predetermined direction, the lift pin 610 is pushed upwardly by a member (not shown) which comprises a part of the transfer mechanism so that the chip type circuit element 20 is separated from the adhesive mat. At this time, the chip type circuit element 20 is picked up by the shifting head 18 (FIG. 7) which shifts the circuit element from the pallet to a mounting head 15 of mounting mechanism 16.

The pallet 8 described above advantageously conveys chip type circuit elements in a reliable manner while avoiding any deviation or rotation of the elements. Additionally, a pallet constructed according to the present invention utilizing an adhesive mat as described above is capable of conveying chip type circuit elements having various configurations.

Mounting Mechanism

The mounting mechanism 16 which mounts the chip type circuit elements 20 on printed circuit boards 3 will now be described in greater detail with reference to FIGS. 19–23. It is noted that such mounting mechanism is specially suited for mounting chip type circuit elements having no lead wires in a one-by-one fashion on a printed circuit board.

Figure 19:
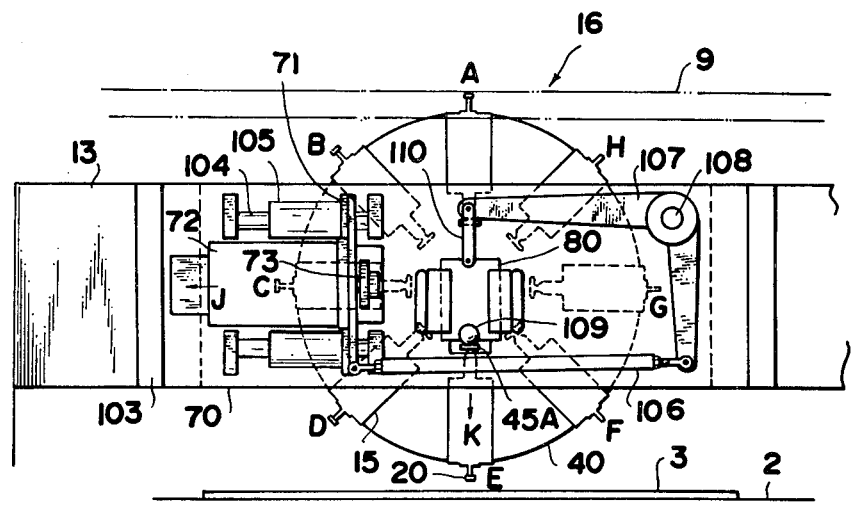
FIG. 19 is a front elevational view of the mounting mechanism and associated components in accordance with one embodiment of the present invention.
Figure 20:
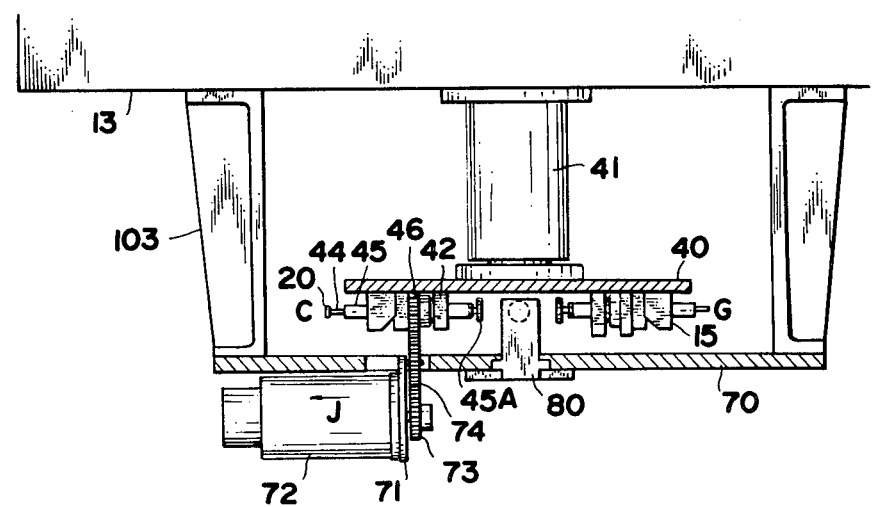
FIG. 20 is a plan view of the mounting mechanism illustrated in FIG. 19.

Referring to FIGS. 19 and 20 which illustrate the mounting mechanism 16 in its entirety, a rotary drive shaft 41 projects forwardly from the frame 13 and an indexing disc 40 is fixed to the rotary drive shaft 41. Eight mounting heads 15 are mounted on the front surface of indexing disc 40 so as to extend radially thereon, each mounting head being spaced from the next at a 45° interval. The mounting heads 15 are moved through points A, B, C, D, E, F, G and H as the indexing disc 40 intermittently rotates at 45° increments in accordance with the intermittent rotation of the rotary drive shaft 41.

Referring to FIGS. 21 and 22 which illustrate the detailed construction of a mounting head 15, bearings 43A and 43B are fixed to the mounting member 42 which in turn is fixed to the indexing disc 40. A mounting head shaft 45 is rotatably and slidably supported in the radial direction of the indexing disc 40 by bearings 43A and 43B. The end portion of the mounting head shaft 45 has a hollow pipe-like cavity formed therein, the end portion of which constitutes a suction chamber 82 which communicates with the atmosphere through a suction bore 83 which is radially formed in the end of the mounting head shaft. An end piece 84 is threaded to the end of the mounting head shaft. A suction pin 44 is provided which extends through the end piece 84, the suction pin 44 being provided with a central axial suction bore 85. A compression spring 86 biases the suction pin 44 so that the latter projects outwardly from the end piece 84. Further, an annular block 48 for securing the spring is fitted around the mounting head shaft 45. Both sides of the annular block 48 are sealed by means of O-rings 87 and 88 which are secured to the mounting head shaft 45. In this manner, the annular spring attaching block 48 moves as a unit together with the mounting head shaft 45 in the axial direction. A radial suction bore 94 is formed in the spring attaching annular block 48. A suction plug 95 having a suction bore 96 which communicates with the suction bore 94 is threaded into the spring attaching annular block 48. The suction plug 95 is connected to a vacuum source such as a vacuum pump through a suction hose. Thus, the vacuum is applied to the suction bore 85 of the suction pin 44 through the suction chamber 82, suction bores 83, 94 and 96 and the suction hose so as to exert a suction force to pick up and hold a chip type electronic component 20. A spring 50 which is stretched between a spring retainer 49 which projects from the indexing disc 40 and the spring attaching annular block 48 acts to bias the mounting head shaft 45 towards a retracting position. Further, a gear 46 is fitted around the mounting head shaft 45 by means of a keyway 47. Thus, the gear 46 is prevented from rotating relative to the mounting head shaft 45 but may slide in the axial direction thereover.

A lock lever 97 is pivotally attached to the rear side of indexing disc 40 through a bracket 98. The front end of the lock lever 97 engages the gear 46 provided on the mounting head 15. A spring 99 is stretched betwen the rear end of the lock lever 97 and a spring retainer pin 100 fixed to the indexing disc 40. Consequently, the lock lever 97 is biased to normally lock the gear 46. An elongated lever 101 pivotally secured to the bracket 98 is operatively connected to the lock lever 97. The arrangement is such that the gear 46 will be unlocked as the roller 102 provided at the end of the elongated lever 101 is pushed upwardly.

As noted above, the mounting heads are moved past the points A, B, C, D, E, F, G and H as the indexing disc 40 is rotated as seen in FIG. 19. The chip type circuit element 20 is received on the mounting head 15 when the latter is directed upwardly, i.e., when it is in the position designated A as seen in FIG. 23.

Figure 23:
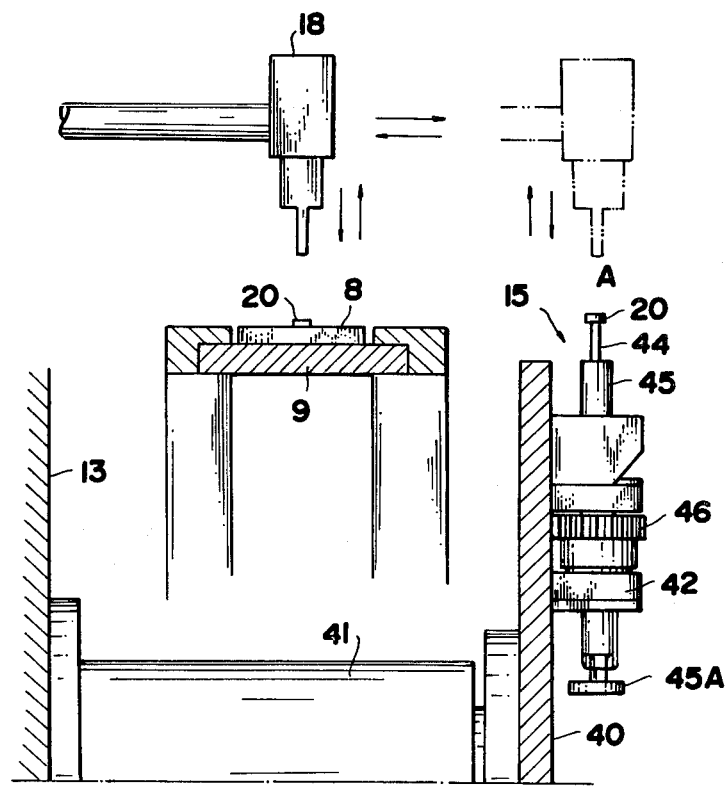
FIG. 23 is a side elevational view in partial section of apparatus for shifting the chip type circuit element to the mounting head.

Referring to FIG. 23, the chip type circuit elements 20 are carried by pallets 8 which are adapted to be moved intermittently by a pallet transfer mechanism 9. A shifting head 18 is provided for shifting the chip type circuit element 20 from the pallet 8 to the suction pin 44 of the mounting head 15. The shifting head 18 is adapted to be lowered from a position above the pallet 8 to pick up the chip type circuit element 20 on the pallet 8 whereupon it is moved upwardly and horizontally to a position above the mounting head 15 situated in position A, to thereby deliver the circuit element 20 onto the suction pin 44 of suction head 15. Subsequent to such delivery, the shifting head 18 releases the circuit element and is moved upwardly to resume the position above the pallets. The chip type circuit element thus delivered to the suction pin 44 of the suction head 15 is picked up and held by the latter.

Referring now to FIGS. 19 and 20, a supporting plate 70 is secured to the front surface of the frame 13 through an attachment piece 103 in a manner such that it extends across a space in front of the indexing disc 40. A pair of supporting shafts 104 are horizontally mounted on the front surface of the supporting plate 70. A motor mounting plate 71 is fixed to a ball bush 105 which is slidable along the support shafts 104. A pulse motor 72 is mounted on the motor mounting plate 71 and has a gear 73 mounted on its output shaft which meshes with the gear 74 which itself is rotatably secured to the motor mounting plate 71. The motor mounting plate 71 is connected through a connecting rod 106 to one end of a bell crank 107 fixed to an operation shaft 108. An operation block 80 is mounted for sliding movement in the vertical direction at the central portion of the supporting plate 70. The operation block 80 has a roller 109 which is adapted to contact the head 45A of the mounting head shaft 45 and is connected to the other end of the bell crank 107 through a link 110.

When the mounting head 15 assumes a lateral position, i.e., the position C, the mounting direction of the chip type circuit element 20 is switched utilizing the pulse motor 72. In this case, during the rotation of the indexing disc 40, the motor mounting plate 71 is moved in the direction of arrow J to remove gear 74 from engagement with the gear 46 of mounting head 15. When the bell crank 107 is rotated to the left with the indexing disc 40 stationary, the roller 102 is pushed upwardly by the mechanism operatively connected to the bell crank 107 whereby the lock lever 97 is disengaged from the gear 46. During this operation, the gears 46 and 74 are brought into engagement with each other so that the torque of the pulse motor 72 is transmitted to the mounting head shaft 45. In this case, the mounting head shaft 46 undergoes a 15° rotation with each operation of the pulse motor 72 so that the chip type circuit element 20 is set at a desired mounting direction with respect to the printed circuit board 3.

Simultaneously with the switching of the mounting direction of the chip type circuit element at the point C, the mounting head 15 moves to position E where it operates to mount the circuit element 20 on the printed circuit board 3 which is carried by the X-Y table 2. More particularly, as the bell crank 107 rotates in a counter-clockwise direction, the operation block 80 is depressed through the link 110 so that the head 45A of the mounting head shaft 45 is depressed as shown by arrow K.

Consequently, the suction pin 44 at the end of the mounting head shaft is lowered while holding the chip type circuit element 20. At its lowest position, i.e., at the position where the chip type circuit element 20 is pressed on to the printed circuit board 3, the application of vacuum to the suction bore 85 is terminated to thereby release the chip type circuit element. It is possible to mount the chip type circuit element 20 in a fixed position on the printed circuit board 3 through the prior application of an adhesive to the mouting positions on the printed circuit board 3 by dispenser 14 (FIG. 9).

The mounting mechanism for the chip type circuit elements described above operates as follows.

When the indexing disc 40 is stationary, a chip type circuit element 20 is delivered by the shifting head 18 to the mounting head 15 while in the position A. The circuit element is picked up and held by the suction pin 44 of the mounting head 15 and is moved to the position B and then position C in accordance with the intermittent rotation of the indexing disc 40. At the position C, the mounting head 15 is driven by the pulse motor 72 for setting the proper mounting direction of the chip type circuit element.

Thereafter, the chip type circuit element is moved to the position E through the position D where the head 45A of the mounting head shaft 45 is depressed by the roller 109 of the operation block 80 to thereby mount the chip type circuit element 20 on the printed circuit board 3 carried on the X-Y table 2. The mounting head 15 which has passed through the position F in a vacant condition is then returned to the position A past the positions F, G and H to receive a new chip type circuit element 20.

From the foregoing, it is seen that the mounting mechanism described above offers the following significant advantages.

Firstly, since the mounting of the chip type circuit element 20 is accomplished by a mounting head having an elongated suction pin 44, it is possible to mount the chip type circuit element even in a limited space on the printed circuit board 3 as in the case where such circuit elements are mounted subsequent to the insertion of other electronic elements in the printed circuit board 3.

Secondly, since the suction pin 44 is biased by compression spring 86, a suitable cushioning effect is provided to insure the safe mounting of the circuit element on the printed circuit board 3 while avoiding the possibility of any damage thereto.

Thirdly, since a plurality of mounting heads 15 are arranged on the indexing disc 40 to successively perform the picking up, mounting direction setting, and mounting of the chip type circuit elements on the printed circuit board, it is possible to obtain relatively high operational speeds.

Accordingly, the present invention provides apparatus whereby a chip type circuit element can be mounted within a small space on a printed circuit board in a reliable and fast manner.

Mechanism For Positioning Chip Type Circuit Elements

It is often desirable to adjust the chip type circuit elements into a correct position as the same are conveyed to the printed circuit board. According to the present invention, the circuit elements are so conveyed by picking up the circuit elements on mounting heads 15 of a mounting mechanism 16 and it is often necessary in this connection to eliminate any deviations of the chip type circuit elements from the desired position and to properly position the chip type circuit element in a desired orientation.

Referring to FIGS. 24-28, apparatus for accomplishing such positioning of a chip type circuit element is disclosed.

Figure 24:
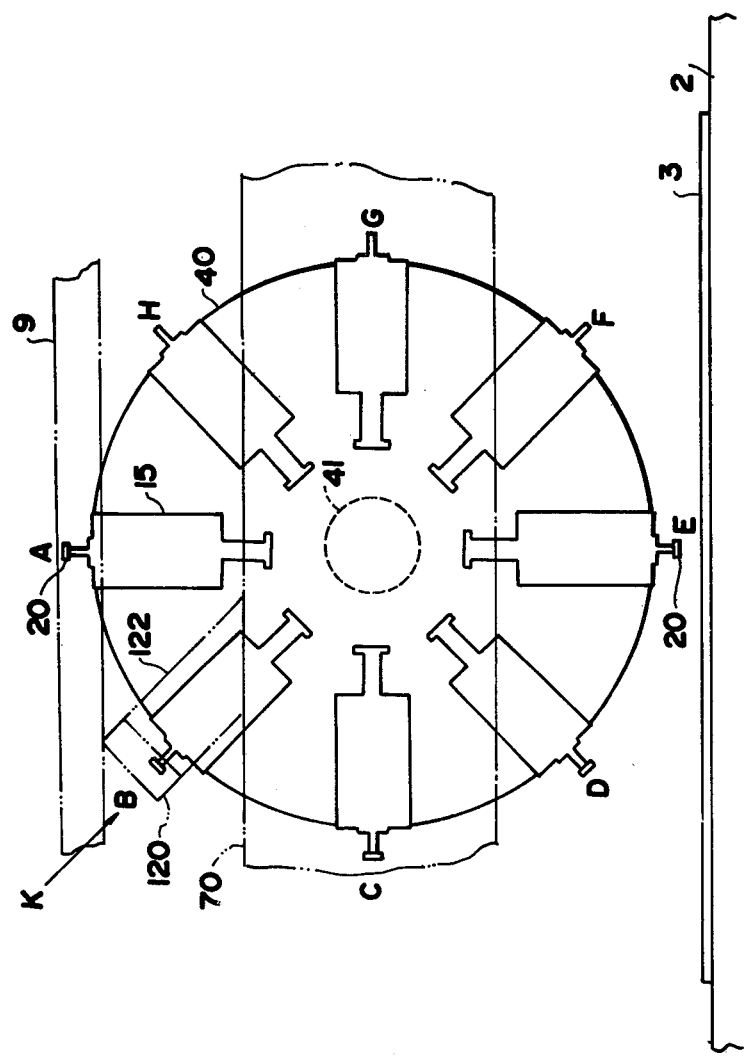
FIG. 24 is a schematic front elevational view of apparatus for positioning the chip type circuit element on the mounting head of the mounting mechanism in accordance with one embodiment of the present invention.

As seen in FIG. 24 and as described in greater detail hereinabove, an indexing disc 40 carries eight mounting heads 15 which are radially arranged on the disc and spaced from each other at 45° intervals. As the rotary drive shafts 41 intermittently rotates through 45° steps, each mounting head 15 is successively moved from a vertical position A through the positions B, C, D, E, F, G and H. When located at the position A, the chip type circuit element 20 is transferred from a pallet which itself has been conveyed by a pallet transfer 9 to the mounting head 15 which is adapted to pick up and hold the chip type circuit element under suction forces. A supporting or attaching plate 70 is situated in front of the indexing disc 40 and has a supporting arm fixed thereto which supports a mechanism, generally designated 120, for positioning the chip type circuit element 20 after the same has been brought to the position B by the indexing disc 40. As described above, the circuit element 20 is mounted on the printed circuit board 3 which is carried on X-Y table 2 by mounting head 15 which has rotated to the position E.

FIGS. 25-27 illustrate in detail the mechanism 120 for positioning the chip type circuit elements. A rack holding block 121 is mounted on a supporting arm 122 which itself is fixed to supporting plate 70 extending upwardly therefrom. A pair of parallel racks 123A and 123B are slidably mounted on the rack holding block 121. A pair of claws 124A and 124B are fixed to the ends of the racks 123A and 123B, respectively, through respective spacers 125A and 125B. A pinion 126 is mounted on the central portion of the rack holding block 121 and meshes with the pair of racks 123A and 123B to drive the same in opposite directions. An operation arm 127 is fixed to pinion 126. A cylinder 129 is fixed to a cylinder supporting arm 128 which extends from the rack holding block 121, a piston rod 130 being reciprocally mounted in cylinder 129. The piston rod 130 extends in a direction such that its end 131 contacts the operation arm 127. A spring 132 is stretched between the operation arm 127 and the supporting arm 128 so as to continually urge the pinion 126 in the clockwise direction as best seen in FIG. 25.

FIG. 28 illustrates the claws 124A and 124B on an enlarged scale. The claws 124A and 124B are formed with respective notches 133A and 133B having orthogonal apex angles. The notches are formed such that as the claws 124A and 124B move with the respective racks 123A and 123B, the apex portions 134A and 134B are always opposed to each other along the diagonal line J which passes through opposed corners of the chip type circuit element when the latter is positioned at its correct location.

The claws 124A and 124B are kept open, i.e., spaced from each other, during the rotation of the indexing disc 40 so as not to hinder the transfer of the chip type circuit element 20. This is accomplished by actuating the cylinder 129 so that the pinion 126 is in its extreme counter-clockwise position. When the rotation of the indexing disc 40 is terminated, i.e., between the intermittent advancements thereof, and a chip is held on a mounting head 15 in the position B (FIG. 24), the cylinder 129 is deactivated so that the pinion 126 rotates in a clockwise direction under the force of spring 132. As a result, the claws 124A and 124B are moved in opposite directions designated by arrows M and N unil they abut the opposed corner or apex portions of the chip type circuit element 20 thereby setting the circuit element in its correct position. In other words, the apex portions 134A and 134B of notches 133A and 133B which are formed in claws 124A and 124B coincide with the corresponding corners of the chip type circuit element 20.

Consequently, the circuit element is set at its correct position even when it is initially picked up by the mounting head in a position which it deviates from its correct position.

After the chip type circuit element is positioned as described above, the claws 124A and 124B are again opened so that the correctly positioned circuit element 20 is then conveyed through the rotation of the indexing disc 40 through the positions C, D, and E whereupon it is finally mounted at the position E on the printed circuit board 3.

The mechanism for positioning chip type circuit elements described above offers several important advantages.

Firstly, since the claws 124A and 124B are moved in the direction of the diagonal line J which passes through opposed corners of the circuit element, the latter will be properly located in both the lateral and vertical directions to thereby eliminate any undesirable deviations in position of the circuit elements 20 from the desired position and, additionally, any deviations in the inclination of the chip type circuit element will also be corrected.

Secondly, the positioning mechanism can be utilized to position circuit elements 20 having varying shapes and sizes as indicated by circuit elements 20A and 20B which have somewhat similar configurations as seen in FIG. 28.

Thirdly, the clamping of the chip type circuit elements 20 by the claws 124A and 124B is accomplished utilizing the resilient force exerted by the spring 132 while resetting of the claws 124A and 124B is effected by the cyliner 129. In this manner, no excessive forces are applied to the chip type circuit element which might damage the same.

Although the embodiment of the positioning mechanism for chip type circuit elements has been described above in connection with positioning the circuit elements as the same are held on a mounting head 15, it is understood that the mechanism is also useful in connection with positioning chip type circuit elements on a pallet as well as to positioning such circuit elements during other steps of the operation of the apparatus. In summary, a mechanism for correctly positioning a chip type circuit element is provided wherein the circuit element can be set in both its correct lateral, and vertical directions as well as in its correct inclination in a reliable manner.

Obviously, numerous modifications and variations of the present invention are possible in the light of the above teachings. It is therefore to be understood that within the scope of the claims appended hereto, the invention may be practiced otherwise than as specifically disclosed herein.

What is claimed is:

1. A suction head for chip type circuit elements comprising a supporting block;
   a pneumatic cylinder affixed to said supporting block, said pneumatic cylinder including an outer cylinder, a piston slidably received within said outer cylinder for movement between an upper and a lower position, and a suction pin operatively connected to said piston;
   means for supplying compressed air to said pneumatic cylinder to lower said piston and suction pin as a unit,
   a suction port opening in the lower end surface of said suction pin; and
   a suction bore formed in said outer cylinder for connection to a vacuum source, said suction bore being located so as to communicate with said suction port when the latter is in said lower position.

2. The suction head of claim 1 additionally comprising a supporting rod engaged with said supporting block and adapted to move in both a horizontal and a vertical direction.

3. The suction head of claim 2, wherein said suction port comprises a section which is adapted to communicate with said suction bore in substantial alignment therewith, said section adapted to communicate with an inner wall of said outer cylinder when not in substantial alignment with said suction bore.

4. A mechanism for picking up chip type circuit elements from a pick-up position and delivering the picked up elements to a delivery position, comprising
   an indexing member adapted to be situated between said pick-up and delivery positions,
   means for rotating said indexing member in an intermittent manner in a rotational plane, and
   a plurality of mounting heads mounted on said indexing member, and wherein each mounting head includes
   a mounting head shaft having an axis situated in a plane substantially parallel to said rotational plane, said mounting head shaft being mounted for both rotation about its axis and for axial sliding movement,
   actuating means for automatically advancing and retracting said mounting head shaft in an axial direction to accomplish at least one of the picking up and delivery of said chip type circuit elements,
   a suction pin mounted on an end of said mounting head shaft and adapted to pick up and hold the chip type circuit element from said pick-up position, and
   means for rotating said mounting head shaft about said axis thereof.

5. The mechanism of claim 4, wherein said rotational plane is substantially vertical.

6. The mechanism of claim 5 wherein said means for rotating said mounting head shaft about said axis thereof is adapted to rotate said mounting head shaft in finite increments through a 360° rotation.

7. The mechanism of claim 6, wherein said means for rotating said mounting head shaft about said axis thereof is adapted to rotate said mounting head shaft about its axis in approximately 15° increments.

8. The mechanism of claim 4 additionally comprising spring means for biasing said suction pin axially outwardly of said mounting head shaft and radially outwardly of said indexing member.

9. The mechanism of claim 8 additionally comprising second spring means for biasing said mounting head shaft inwardly along said axis thereof and radially inwardly with respect to said indexing member.

10. The mechanism of claim 8 wherein said spring means is mounted to move as a unit with said mounting head shaft when said mounting head shaft slides in said axial direction.

* * * * *